(12) United States Patent
Lavy et al.

(10) Patent No.: US 11,967,390 B2
(45) Date of Patent: *Apr. 23, 2024

(54) APPARATUS WITH CIRCUIT-LOCATING MECHANISM

(71) Applicant: Micron Technology, Inc., Boise, ID (US)

(72) Inventors: Itamar Lavy, Rockville, MD (US); Chunhao Wang, Chantilly, VA (US); Wesley B. Butler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/059,335

(22) Filed: Nov. 28, 2022

(65) Prior Publication Data

US 2023/0087823 A1 Mar. 23, 2023

Related U.S. Application Data

(63) Continuation of application No. 16/536,470, filed on Aug. 9, 2019, now Pat. No. 11,551,777.

(51) Int. Cl.
*G11C 29/44* (2006.01)
*G11C 29/04* (2006.01)
(Continued)

(52) U.S. Cl.
CPC ........ *G11C 29/44* (2013.01); *H01L 21/67242* (2013.01); *H01L 21/67259* (2013.01);
(Continued)

(58) Field of Classification Search
CPC ....... H01L 21/67242; H01L 121/67259; H01L 21/67282; H01L 21/67294; H01L 23/544; H01L 2223/54406; H01L 2223/54426; H01L 2223/54433; H01L 2223/54473; H01L 27/105; G11C 2029/0403; G11C 29/44; G11C 5/025; G11C 2029/4402;
(Continued)

(56) References Cited

U.S. PATENT DOCUMENTS 5,369,261 A * 11/1994 Shamir ............ G06K 19/06037
235/468
6,555,922 B1  4/2003 Nakagawa
(Continued)

FOREIGN PATENT DOCUMENTS

EP     3671702 A1   6/2020
JP  2007027503 A   2/2007
(Continued)

OTHER PUBLICATIONS

Office Action dated May 19, 2023 for Japanese Patent Application No. 2022-507765, 15 pages (with translation.).
(Continued)

*Primary Examiner* — Victor A Mandala
(74) *Attorney, Agent, or Firm* — Perkins Coie LLP

(57) ABSTRACT

An apparatus includes a substrate; circuit components disposed on the substrate; and a location identifier layer over the circuit, wherein the location identifier layer includes one or more section labels for representing physical locations of the circuit components within the apparatus.

20 Claims, 14 Drawing Sheets

(51) Int. Cl.
*H01L 21/67* (2006.01)
*H01L 23/544* (2006.01)

(52) U.S. Cl.
CPC .. *H01L 21/67282* (2013.01); *H01L 21/67294* (2013.01); *H01L 23/544* (2013.01); *G11C 2029/0403* (2013.01)

(58) Field of Classification Search
CPC .......... G11C 29/04; G11C 2223/54406; G11C 2223/54426; G11C 2223/54433; G11C 2223/54473; G11C 27/105
See application file for complete search history.

(56) References Cited

U.S. PATENT DOCUMENTS

| | | | |
|---|---|---|---|
| 7,324,373 B2 | 1/2008 | Shimada | |
| 8,595,654 B1* | 11/2013 | Chen | H01L 23/544 |
| | | | 716/51 |
| 10,685,166 B1* | 6/2020 | Kao | G06F 30/398 |
| 11,551,777 B2* | 1/2023 | Lavy | H01L 21/67282 |
| 2003/0003728 A1* | 1/2003 | Teshima | H01L 23/544 |
| | | | 257/E23.179 |
| 2007/0207570 A1* | 9/2007 | Choi | H01L 21/67282 |
| | | | 438/106 |
| 2008/0057677 A1* | 3/2008 | Charles | H01L 23/544 |
| | | | 257/797 |
| 2009/0155959 A1 | 6/2009 | Lin et al. | |
| 2010/0006905 A1 | 1/2010 | Hirabayashi | |
| 2010/0279231 A1* | 11/2010 | Sandtner | G03F 7/70391 |
| | | | 430/311 |
| 2013/0299939 A1* | 11/2013 | Amoah | H01L 23/544 |
| | | | 257/E21.328 |
| 2015/0017736 A1 | 1/2015 | Satzger et al. | |
| 2016/0064296 A1 | 3/2016 | Suzumura et al. | |
| 2016/0125583 A1* | 5/2016 | Amanullah | G06T 7/001 |
| | | | 348/87 |
| 2017/0045629 A1 | 2/2017 | Antonuk | |
| 2017/0310859 A1* | 10/2017 | Kim | H01L 27/14609 |
| 2018/0233323 A1* | 8/2018 | Walsh | G01N 21/00 |
| 2018/0269091 A1* | 9/2018 | Ophir | H01L 21/67294 |
| 2020/0119736 A1* | 4/2020 | Weber | H03K 19/17756 |
| 2020/0411132 A1* | 12/2020 | Hulton | G06F 12/126 |
| 2021/0043267 A1* | 2/2021 | Lavy | H01L 21/67259 |

FOREIGN PATENT DOCUMENTS

| | | |
|---|---|---|
| JP | 2009054817 A | 3/2009 |
| JP | 2009246267 A | 10/2009 |
| JP | 5324808 B2 | 7/2013 |
| JP | 2015079848 A | 4/2015 |
| JP | 199709199 | 5/2023 |

OTHER PUBLICATIONS

International Application No. PCT/US2020/033656—International Search Report and Written Opinion, dated Sep. 4, 2020, 10 pages.
Extended European Search Report dated Sep. 5, 2023 for European Patent Application No. 20852777.0, 10 pages.

* cited by examiner

APPARATUS WITH CIRCUIT-LOCATING MECHANISM

CROSS-REFERENCE TO RELATED APPLICATION(S)

This application is a continuation of U.S. patent application Ser. No. 16/536,470, filed Aug. 9, 2019, now U.S. Pat. No. 11,551,777, which is incorporated herein by reference in its entirety.

TECHNICAL FIELD

The disclosed embodiments relate to apparatus, and, in particular, to electronic apparatus with a circuit-locating mechanism.

BACKGROUND

Electronic apparatus (e.g., silicon-based devices) frequently experience circuit defects that may form during manufacturing, testing, and/or after deployment. For example, memory devices, frequently provided as internal, semiconductor, integrated circuits, and/or external removable devices in computers or other electronic devices, can include defective storage circuits (e.g., memory cells). While different types of memory may exist, such as volatile and non-volatile memory, the defective storage circuits can occur regardless of the type. For example, volatile memory, including random-access memory (RAM), static random-access memory (SRAM), dynamic random-access memory (DRAM), and/or synchronous dynamic random-access memory (SDRAM), may include defective memory transistors. Also, non-volatile memory, such as flash memory (e.g., NAND and NOR) phase change memory (PCM), resistive random-access memory (RRAM), and/or magnetic random-access memory (MRAM), may include defective floating gate transistors and/or other circuit units. Because such circuit defects can negatively impact other non-defective circuits, circuit defects are typically located and remedied/removed before deployment of the apparatus.

FIG. 1A is a schematic cross-sectional view of a conventional silicon device 100 ("device 100"). The device 100 includes a silicon substrate 102 and a circuit component layer 106 that includes electronic circuit components (e.g., transistors). The device 100 further includes one or more metal layers (e.g., a bottom metal layer 104 and/or a top metal layer 106) that connect to and route electrical signals to/from the electronic circuit components. The device 100 also includes one or more insulative layers 110 (e.g., oxide material) disposed between the circuit component layer 106 and the metal layers. Accordingly, the insulative layers 110 provide limited connections between the circuit components and the metal layers, and otherwise electrically insulate other portions of the circuit from the metal layers. The device 100 may include a passivation layer 112 that forms a top surface above the silicon substrate 102 and protects/insulates one or more of the metal layers and/or the circuit component layer 106 from the external environment.

For illustrating conventional designs, FIG. 1B is a schematic top view of a portion of a silicon device (e.g., the device 100), FIG. 1C is a top view of a conventional top metal layer (e.g., the top metal layer 106), FIG. 1D is a top view of a portion of a silicon device including a defective circuit, FIG. 1E is an example display illustrating the silicon device including the defective circuit, and FIG. 1F is a top view of a portion of a silicon device including a surface defect. Referring to FIGS. 1A-1F together, the device 100 may include one or more defective circuits 120, such as unintended shorts, malfunctioning transistors, etc. However, locating the defective circuits 120 is typically based on other circuit connections, which can be repetitive and/or numerous in quantity. As an illustrative example, when the device 100 is a memory device, the defective circuits 120 in storage circuits (e.g., the memory arrays) may be difficult to locate due to the repetitive arrangement of the numerous individual cells. The defective circuits 120 may be located by counting a first set of marks 122 (e.g., word line marks/connections) along one direction and a second set of marks 124 (e.g., bit line marks/connections) along an orthogonal direction. As stated, due to the extremely large number of memory cells and repetitive nature of the circuit connections, such counting is difficult and often erroneous.

The top metal layer 106 may further complicate efforts to locate the defective circuits 120. The top metal layer 106 may include a repetitive pattern, such as a mesh pattern or a serpentine pattern, as illustrated in FIGS. 1C-1D, that further introduce repetitive patterns that increase the difficulties in locating the defective circuits 120. The top metal layer 106 may be viewable during visual inspection and/or when viewing the device 100 using processing tools (e.g., microscopes, laser/x-ray/ultraviolet light cameras, etc.). For example, the top metal layer 106 may be seen in circuit viewer displays 150 (e.g., an emission microscope image). Identifying/referencing potential fault locations 152 (e.g., hotspots) displayed on the circuit viewer displays 150 may be difficult due to the simultaneously presented repetitive patterns of the top metal layer 106 as shown in FIG. 1E. Similarly, the repetitive patterns make it difficult to locate/reference surface defects 132 that may be in/above/below the top metal layer 106 as shown in FIG. 1F.

DETAILED DESCRIPTION

As described in greater detail below, the technology disclosed herein relates to electronic apparatus, systems with electronic apparatus, and related methods for locating circuits therein. The apparatus includes a location identifier layer that provides a reference for locating circuit components within the apparatus. In some embodiments, the location identifier layer can be a metal layer that includes a repetitive pattern, such as a metal mesh that includes boundaries (e.g., metal portions) and slots (e.g., area/space encircled by the boundaries). The location identifier layer can include section labels, such as symbols, letters, and/or numbers, used to mark and identify physical locations within the apparatus. In other words, the section labels can be legible writings or patterns that can serve as markings that identify a corresponding area/region. In some embodiments, the section labels can be formed by filling select slots with fillers (e.g., dummy fillers and/or oxide material) according to a predetermined pattern. Remaining slots can remain unfilled or they can be filled with different filler material (e.g., different oxide material).

For illustrative purposes, the apparatus will be described in the context of a flash memory device that includes one or more two-dimensional (2D) memory arrays. However, it is understood that the technology disclosed herein can be implemented in other contexts/embodiments, such as for non-memory devices (e.g., processors or logic devices) and/or other memory devices (e.g., volatile memory devices and/or magnetic memory devices).

Figure 2A:
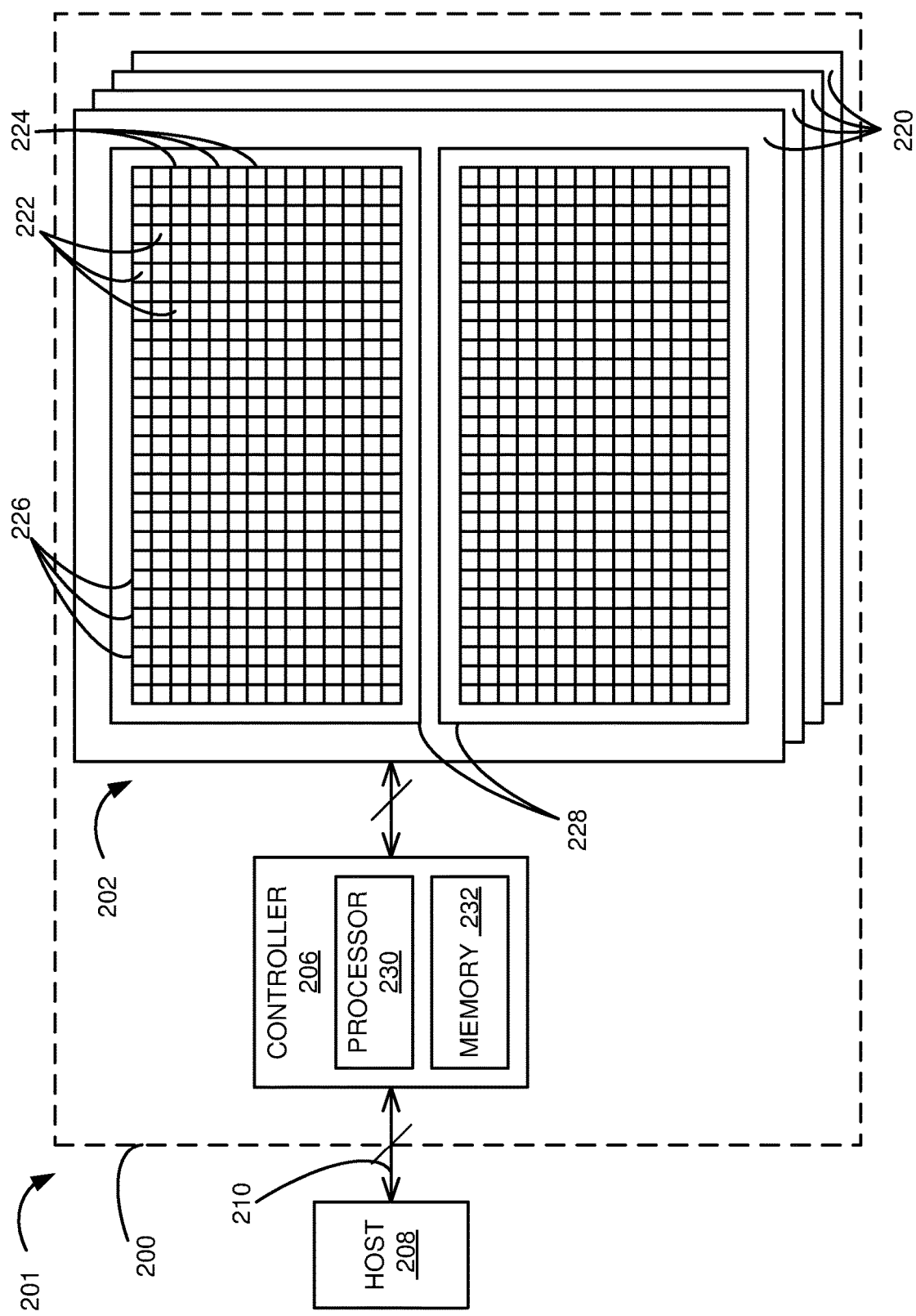
FIG. 2A is a block diagram of an apparatus configured in accordance with an embodiment of the present technology.

FIG. 2A is a block diagram of a system 201 having an apparatus (e.g., a memory device 200) configured in accordance with an embodiment of the present technology. As shown, the memory device 200 includes a main memory 202 (e.g., NAND flash, NOR flash, chalcogenide PCM, etc.) and a controller 206 operably coupling the main memory 202 to a host device 208 (e.g., an upstream central processing unit (CPU)). The main memory 202 includes a plurality of memory regions, or memory units 220, which each include a plurality of memory cells 222. Memory units 220 can be individual memory dies, memory planes in a single memory die, a stack of memory dies vertically connected with through-silicon vias (TSVs), or the like. For example, in one embodiment, each of the memory units 220 can be formed from a semiconductor die and arranged with other memory unit dies in a single device package (not shown). In other embodiments, multiple memory units 220 can be co-located on a single die and/or distributed across multiple device packages. The memory cells 222 can include, for example, floating gate, charge trap, phase change, ferroelectric, magnetoresistive, and/or other suitable storage elements configured to store data persistently or semi-persistently. The main memory 202 and/or the individual memory units 220 can also include other circuit components (not shown), such as multiplexers, decoders, buffers, read/write drivers, address registers, data out/data in registers, etc., for accessing and/or programming (e.g., writing) the memory cells 222 and other functionality, such as for processing information and/or communicating with the controller 206.

Memory cells 222 can be arranged in rows 224 (e.g., each corresponding to a word line) and columns 226 (e.g., each corresponding to a bit line). Each word line can include one or more memory pages, depending upon the number of data states the memory cells 222 of that word line are configured to store. For example, a single word line of memory cells 222 in which each memory cell 222 is configured to store one of two data states (e.g., SLC memory cells configured to store one bit each) can include a single memory page. Alternatively, a single word line of memory cells 222 in which each memory cell 222 is configured to store one of four data states (e.g., MLC memory cells configured to store two bits each) can include two memory pages. Moreover, memory pages can be interleaved so that a word line comprised of memory cells 222 in which each memory cell 222 is configured to store one of two data states (e.g., SLC memory cells) can span two memory pages, in an "even-odd bit line architecture," where all the memory cells 222 in odd-numbered columns 226 of a single word line are grouped as a first memory page, and all the memory cells 222 in even-numbered columns 226 of the same word line are grouped as a second memory page. When even-odd bit line architecture is utilized in a word line of memory cells 222 in which each memory cell 222 is configured to store larger numbers of data states (e.g., memory cells configured as MLC, TLC, QLC, etc.), the number of memory pages per word line can be even higher (e.g., 4, 6, 8, etc.).

Each column 226 can include a string of series-coupled memory cells 222 connected to a common source. The memory cells 222 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 222 can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, blocks, and memory units can vary, and can, in other embodiments, be larger or smaller in scale than shown in the illustrated examples. For example, in some embodiments, the memory device 200 can include only one memory unit 220. Alternatively, the memory device 200 can include 2, 3, 4, 8, 20, or more (e.g., 26, 32, 64, or more) memory units 220. Although the memory units 220 are shown in FIG. 2 as including two memory blocks 228 each, in other embodiments, each memory unit 220 can include 1, 3, 4, 8, or more (e.g., 26, 32, 64, 200, 228, 256, or more memory blocks). In some embodiments, each memory block 228 can include, for example, $2^{15}$ memory pages, and each memory page within a block can include, for example, $2^{12}$ memory cells 222 (e.g., a "4 k" page).

The controller 206 can be a microcontroller, special purpose logic circuitry (e.g., a field programmable gate array (FPGA), an application specific integrated circuit (ASIC), etc.), or other suitable processor. The controller 206 can include a processor 230 configured to execute instructions stored in memory. In the illustrated example, the memory of the controller 206 includes an embedded memory 232 configured to perform various processes, logic flows, and routines for controlling operation of the memory device 200, including managing the main memory 202 and handling communications between the memory device 200 and the host device 208. In some embodiments, the embedded memory 232 can include memory registers storing, for example, memory pointers, fetched data, etc. The embedded memory 232 can include volatile and/or non-volatile memory (e.g., DRAM, SRAM, NAND, NOR, PCM) for storing the memory registers, and can also include read-only memory (ROM) (e.g., for storing micro-code). Although in the example set forth in FIG. 2, a memory device 200 has been illustrated as including a controller 206, in another embodiment of the present technology, a memory device may not include a controller, and may instead rely upon external control (e.g., provided by an external host, or by a processor or controller separate from the memory device).

In operation, the controller 206 can directly write or otherwise program (e.g., erase) the various memory regions of the main memory 202, such as by writing to groups of memory pages and/or memory blocks 228. In NAND-based memory, a write operation often includes programming the memory cells 222 in selected memory pages with specific data values (e.g., a string of data bits having a value of either logic 0 or logic 1). An erase operation is similar to a write operation, except that the erase operation re-sets an entire memory block 228 or multiple memory blocks 228 to the same data state (e.g., logic 1).

The controller 206 communicates with the host device 208 over a host-device interface 210. In some embodiments, the host device 208 and the controller 206 can communicate over a serial interface, such as a serial attached SCSI (SAS), a serial AT attachment (SATA) interface, a peripheral component interconnect express (PCIe), or other suitable interface (e.g., a parallel interface). The host device 208 can send various requests (in the form of, e.g., a packet or stream of packets) to the controller 206. A request can include a command to write, erase, return information, and/or to perform a particular operation (e.g., a TRIM operation). A request can also include an interrupt or another command that indicates a change in condition (e.g., a power loss event), which can trigger the implementation of a power loss algorithm.

Host device 208 can be any one of a number of electronic devices capable of utilizing memory for the temporary or persistent storage of information, or a component thereof. For example, host device 208 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). Host device 208 may be a networking device (e.g., a switch, a router, etc.) or a recorder of digital images, audio and/or video, a vehicle, an appliance, a toy, or any one of a number of other products. In one embodiment, host device 208 may be connected directly to memory device 200, although in other embodiments, host device 208 may be indirectly connected to memory device 200 (e.g., over a networked connection or through intermediary devices).

Figure 2B:
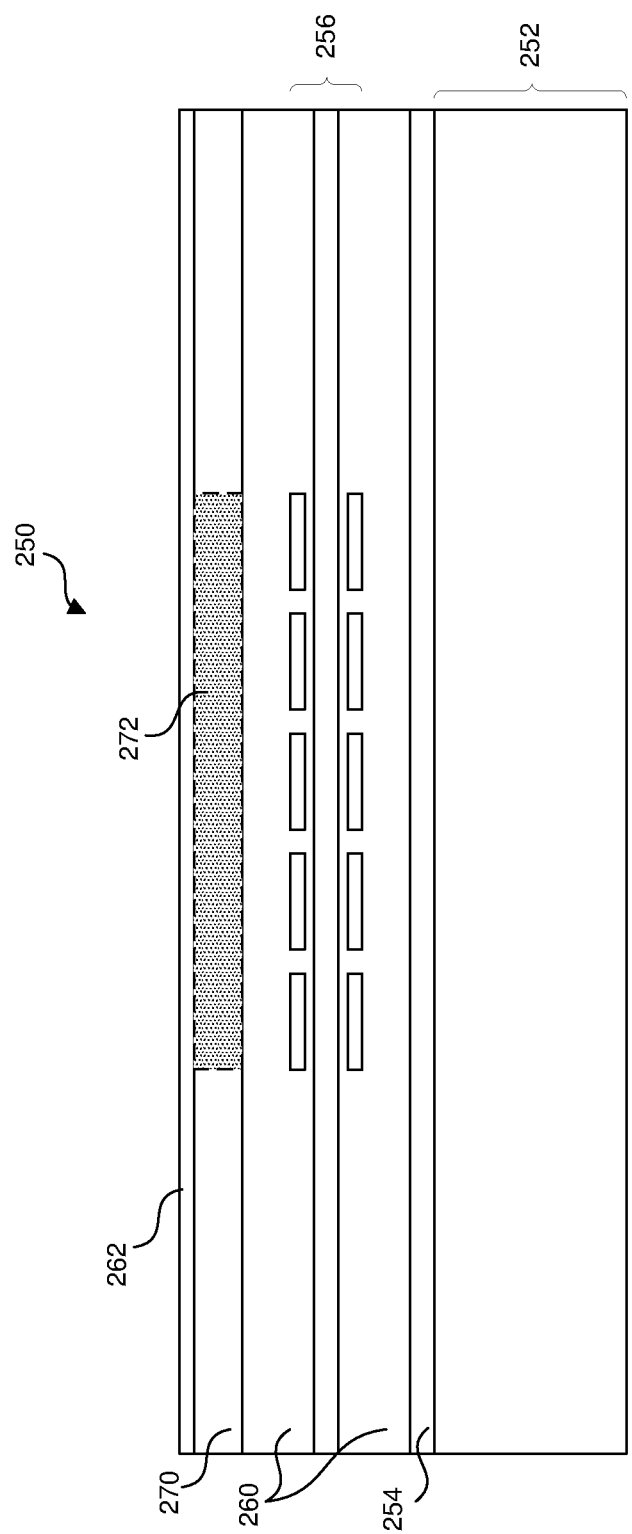
FIG. 2B is a schematic view of an integrated circuit device configured in accordance with an embodiment of the present technology.

Various portions of the system 201 and/or the apparatus can be implemented using integrated circuit devices. FIG. 2B is a schematic cross-sectional view of an integrated circuit device 250 ("device 250") configured in accordance with an embodiment of the present technology. The device 250 can have a substrate 252 and a circuit component layer 256 that can include electronic circuit components (e.g., transistors, resistors, capacitors, etc.). The device 250 can further include one or more metal layers 254 that are coupled to and route electrical signals to/from the electronic circuit components (e.g., components within the circuit component layer 256). The device 250 also includes one or more insulative layers 260 (e.g., oxide material) disposed between the circuit component layer 256 and the metal layers 254. Accordingly, the insulative layers 260 provide limited electrical connections between the circuit components and the metal layers 254, and otherwise electrically insulate other portions of the circuit from the metal layers. The device 250 can include a passivation layer 262 that forms a top surface above the silicon substrate 252 that protects/insulates the device 250 from the external environment.

As described in detail below, the device 250 can include a location identifier layer 270 that includes visual markings/indicators (i.e., section labels 272) identifying different physical locations and/or areas of the device 250. The section labels 272 can include symbols, letters, numbers, or a combination thereof that are written on the location identifier layer 270. The location identifier layer 270 can extend along a horizontal plane and each of the section labels 272 can identify a unique location/area along the horizontal plane. Accordingly, the section labels 272 can be used to provide visual references for locating and/or identifying one or more circuit components and/or other physical aspects (e.g., defects) of the device 250. In some embodiments, the section labels 272 can replace the wordline marks as the visual references for locating and/or identifying circuit components or other physical features.

In some embodiments, the location identifier layer 270 can be a metal layer, such as a top metal layer or a different internal metal layer. For example, the location identifier layer 270 can include an electrically-functional metal layer (e.g., top metal layer) that is coupled to and routes electrical signals and/or provides reference voltage connections, such as supply voltage and/or ground, to functional circuits (e.g., circuitry components within the circuit component layer 256). Also, the location identifier layer 270 can be non-functional for electrical connections. In other embodiments, the location identifier layer 270 can include other non-metallic material, such as oxide or polymer material. In some embodiments, the location identifier layer 270 can be a planar structure having a repetitive pattern (e.g., a mesh pattern) that forms slots encircled by the material of the location identifier layer 270 (e.g., a metallic and/or an electrically conductive material). In some embodiments, as described in detail below, the section labels 272 can be formed based on filling the slots, such as with dummy fillers, to illustrate/form the symbols, the letters, etc. Dummy fillers can include oxide material that is used for the section labels 272 without necessarily providing other (e.g., encapsulating and/or protective) functions. In some embodiments, the slots can have dimensions (e.g., lengths and/or widths) less than 100 μm. As an illustrative example, the slots can have a rectangular shape with a length of 4 μm and a width of 1 μm.

For illustrative purposes, the location identifier layer 270 is described with respect to the main memory 202 of FIG. 2 (e.g., the memory units 220 of FIG. 2 and the memory cells 222 of FIG. 2 therein). However, it is understood that the location identifier layer 270 can overlap and provide markers/indicators for locating other circuits (e.g., the controller 206, logic circuits, etc.). For example, the section labels 272 can be placed above, below, and/or adjacent to buffers, amplifiers, logic gates, traces, etc., in the device 250.

Figure 3A:
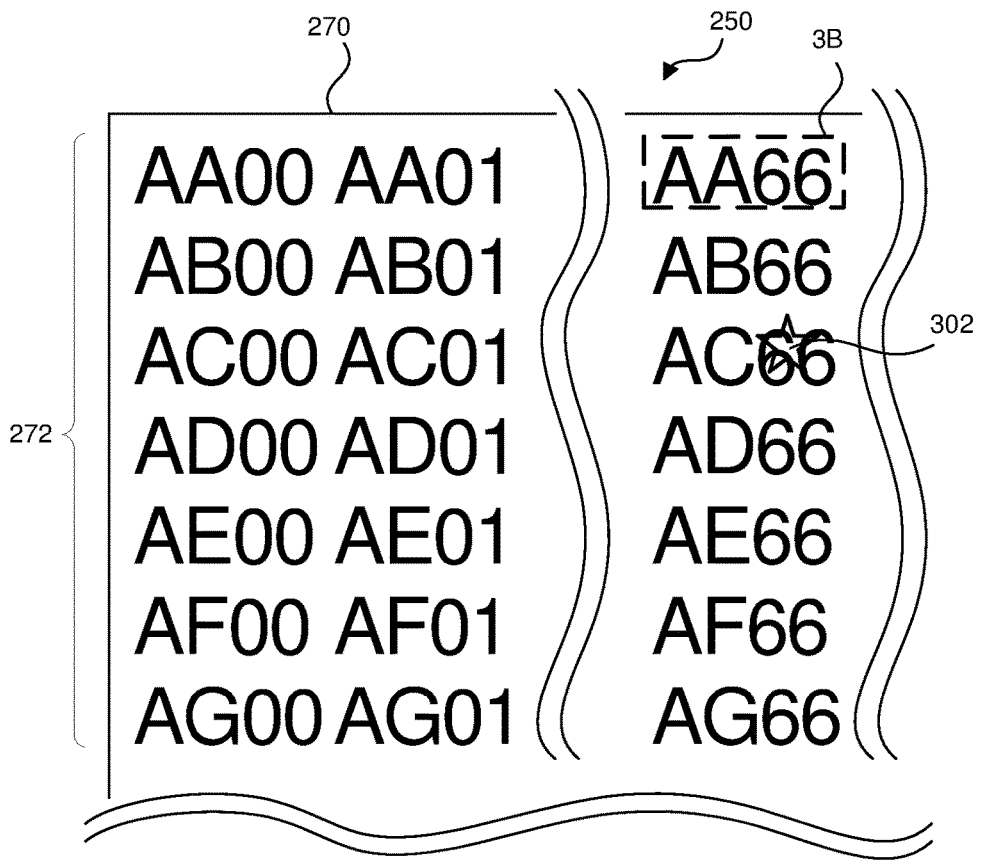
FIG. 3A is a schematic top view of a portion of the apparatus in accordance with an embodiment of the present technology.

FIG. 3A is a schematic top view of a portion of the apparatus (e.g., the device 250) in accordance with an embodiment of the present technology. As described above, the device 250 can include the location identifier layer 270 extending along horizontal directions across the device 250. In some embodiments, the location identifier layer 270 can include the section labels 272 that follow one or more patterns across the location identifier layer 270. For example, the section labels 272 can include letters and/or numbers that increment along a corresponding direction (e.g., along a width and/or a length). As illustrated in FIG. 3A, the section labels 272 can include numbers that increment along a first direction and letters that increment along a second direction that is orthogonal to the first direction.

As described above, the location identifier layer 270 can include the section labels 272 that can be used to describe locations/areas along the horizontal directions. For example, the location identifier layer 270 can be used to identify a physical location of one or more target circuits 302 (e.g., defective circuits/components) on the device 250. For the example illustrated in FIG. 3A, the location of the target circuit 302 is over/under area 'AC66' and/or the first '6' therein. Accordingly, the section labels 272 can provide simpler/efficient locating mechanisms, thereby reducing potential user errors in locating the circuits, in comparison to the conventional devices described above. For example, the section labels 272 can reduce or eliminate any counting (e.g., for the word line and/or the bit lines) necessary to specify the location of the target circuits 302. Also, the section labels 272 can provide an efficient mechanism for locating and/or identifying the target circuits 302 and/or defects associated with repetitive (based on, e.g., a set of components having similar or matching shapes, types, arrangements, and/or spacings) portions within the circuitry, such as the memory cells 222 of FIG. 2A.

Figure 3B:
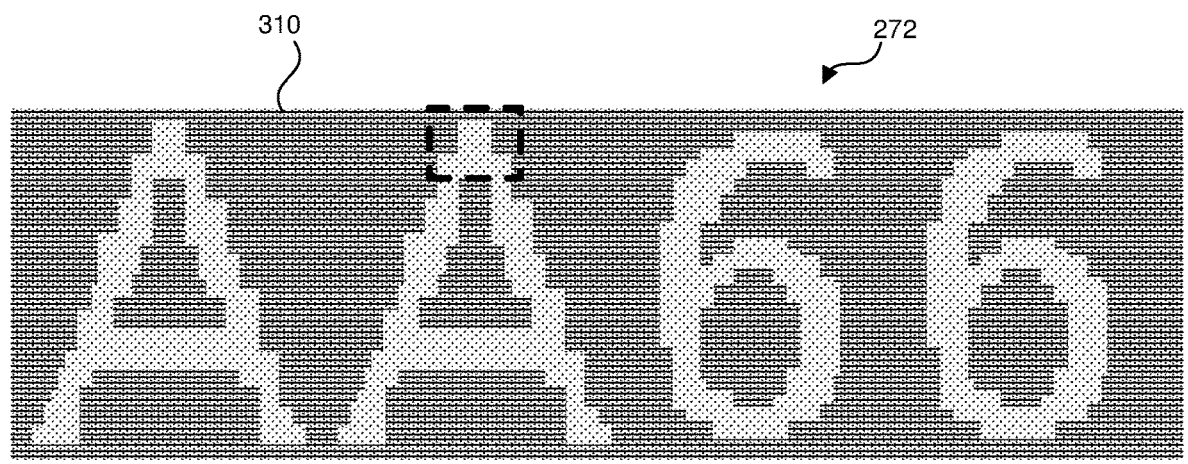
FIG. 3B is a detailed view of a segment 3B shown in FIG. 3A in accordance with an embodiment of the present technology.
Figure 3C:
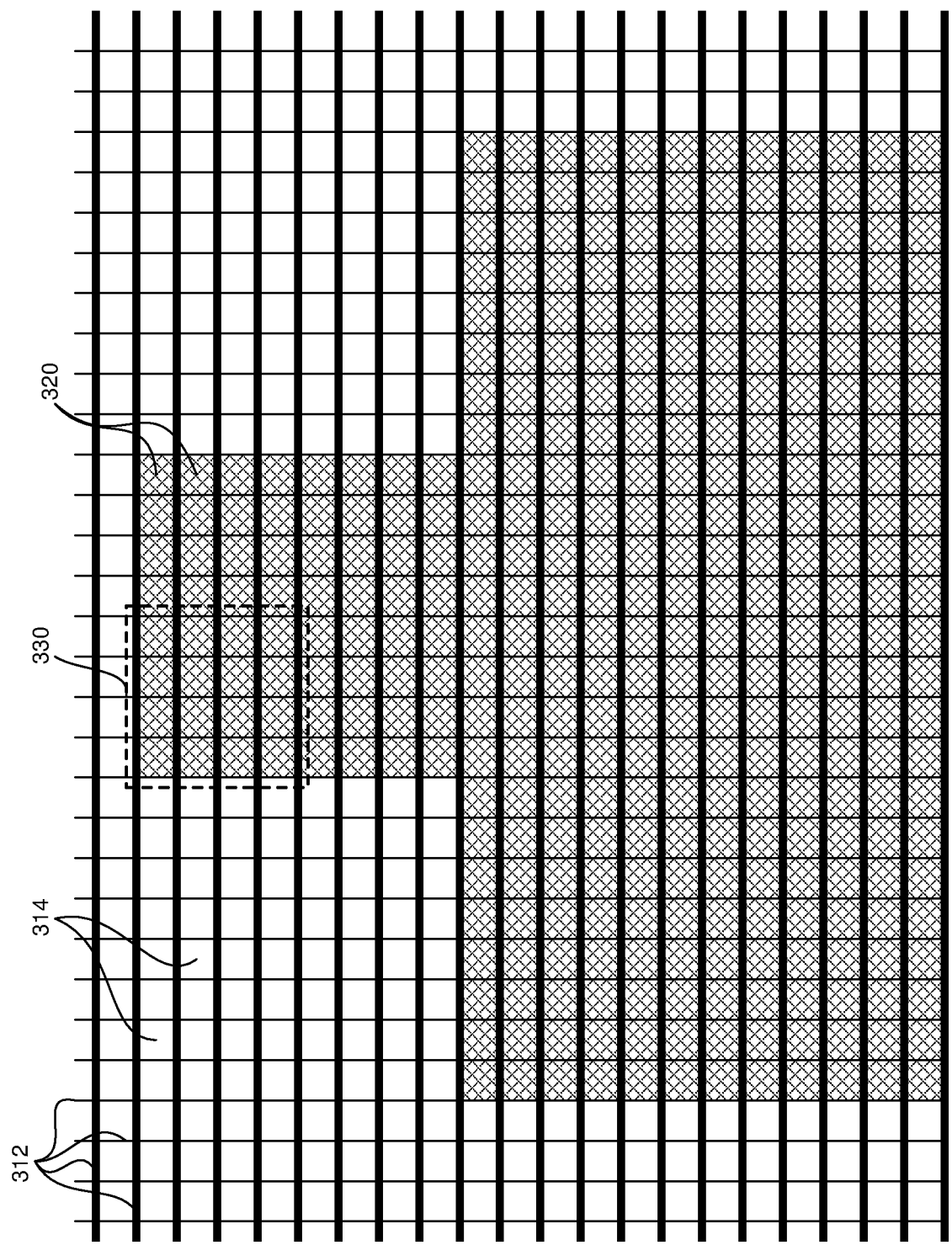
FIG. 3C is a detailed view of a segment 3C shown in FIG. 3B in accordance with an embodiment of the present technology.

For illustrating example details of the section labels 272, FIG. 3B is a detailed view of a segment 3B shown in FIG. 3A, and FIG. 3C is a further detailed view of a segment 3C shown in FIG. 3B in accordance with an embodiment of the present technology. Referring to FIGS. 3B and 3C together, the location identifier layer 270 of FIG. 2B can include macro-cells 310 that each include a unique region or area in the location identifier layer 270, such as across a lateral plane/surface thereof. Each of the macro-cells 310 can correspond to one of the section labels 272.

In some embodiments, the location identifier layer 270 can include a metallic layer/structure or a portion thereof that has a mesh design. For example, the location identifier layer 270 can include boundaries 312 (e.g., metal connections) that define slots 314. Accordingly, the section labels 272 can be formed based on filling a set of the slots 314 with an identifier filler 320 (e.g., a dummy filler) according to a predetermined pattern to illustrate/write the corresponding symbols, letters, and/or numbers. In other words, each of the section labels 272 can include the set of slots 314 within the corresponding macro-cell 310 that are filled with the dummy filler to form or display the unique set of letters, numbers, and/or symbols. Accordingly, the section labels 272 can provide visual references for identifying and/or locating the corresponding regions/areas, including any circuitry components and/or physical characteristics (e.g., defects) within the device 250. In some embodiments, other instances of the slots 314 can remain unfilled or filled with a different material. In some embodiments, the identifier filler 320 can have at least one physical characteristic, such as density, color, and/or composition.

In some embodiments, the slots 314 can correspond to label pixels 330 and/or associated coordinates along a plane (e.g., a lateral/horizontal surface of the device 250). The symbols, letters, and/or the numbers for the section labels 272 can be illustrated using the label pixels 330, similar to how symbols, letters, and/or the numbers are shown on digital displays. For example, each of the label pixels 330 can include a set of one or more of the slots 314 in the areas represented by the section labels 272 (e.g., 4 slots by 4 slots as illustrated in FIG. 3C). Each of the label pixels 330 can be identified (e.g., numbered and/or according to a coordinate system) according to its relative location within the represented area and/or the location identifier layer 270. A set of the label pixels 330 can be filled with the identifier filler 320 to form/show the symbols, letters, and/or the numbers for the corresponding section label 272. In one or more embodiments, one or more of the slots 314 can be marked (via, e.g., a different type of filler having a different visual characteristic, such as color, density, composition, etc., or by keeping the slots unfilled) in each of the label pixels 330 for visually identifying the corresponding pixels. In other words, each of the pixels 330 can include the markings that can be used to visually identify boundaries of the corresponding pixel. Accordingly, the label pixels 330 can be utilized in locating the target circuit.

Figure 4:
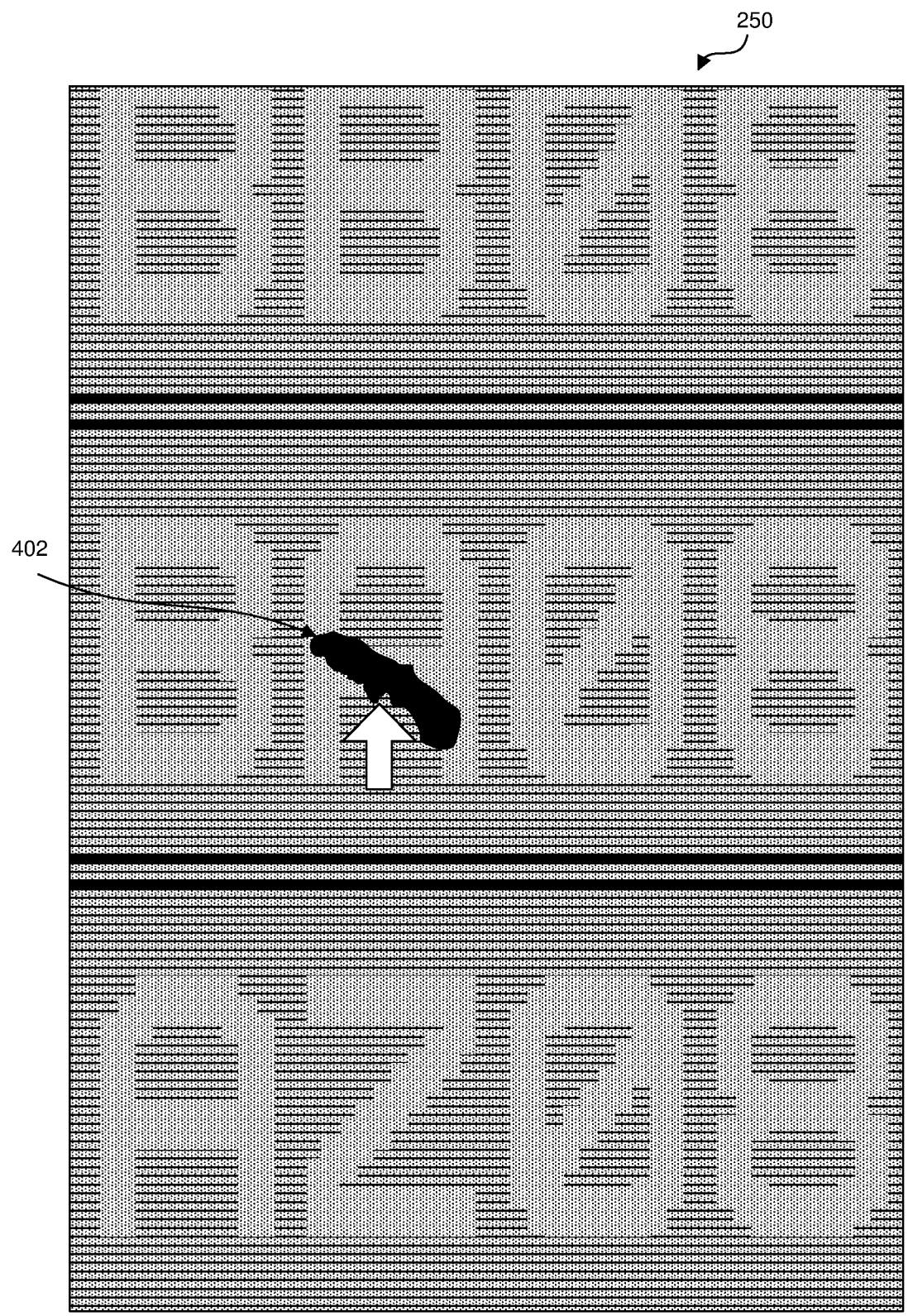
FIG. 4 is a top view illustrating surface characteristics of a portion of the apparatus in accordance with an embodiment of the present technology.

For illustrating example defects relative to the section labels 272, FIG. 4 is a top view illustrating surface characteristics of a portion of the apparatus (e.g., the device 250) in accordance with an embodiment of the present technology. The device 250 may include an unintended defect 402 on the location identifier layer 270 of FIG. 2B and/or in one or more structures above/below the location identifier layer 270. For example, the device 250 can include the defect 402 on the top metal layer, the passivation layer 262 of FIG. 2B, the insulative layers 260 of FIG. 2B, the circuit component layer 256 of FIG. 2B, etc.

Figure 1A:
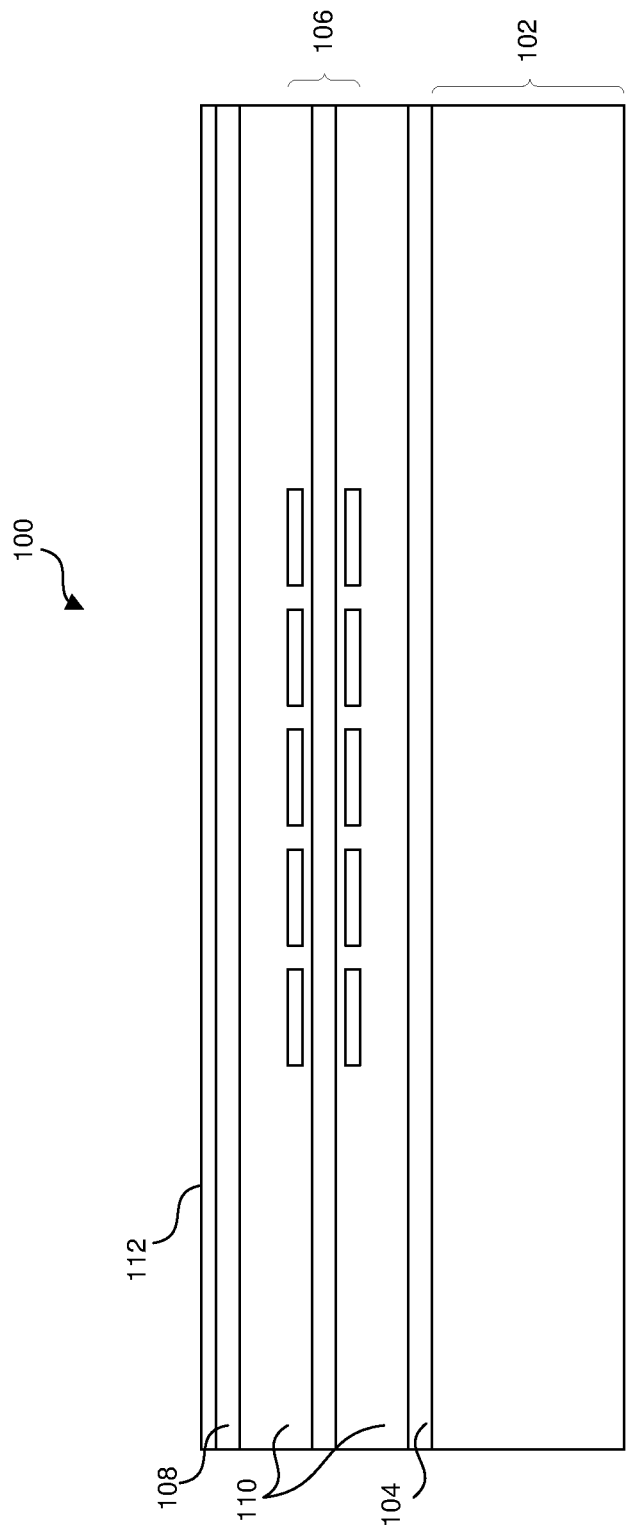
FIG. 1A is a schematic view of a silicon device.
Figure 1B:
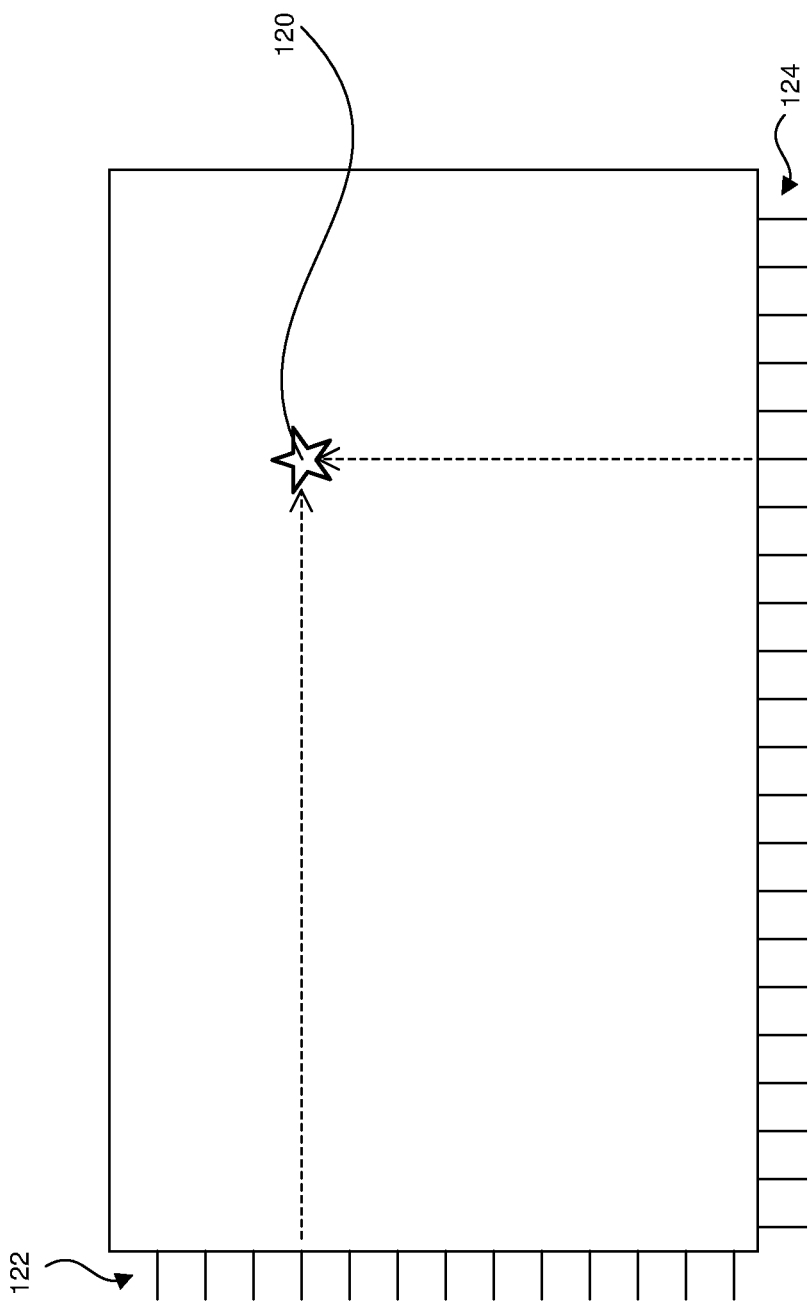
FIG. 1B is a schematic top view of a portion of the silicon device.
Figure 1C:
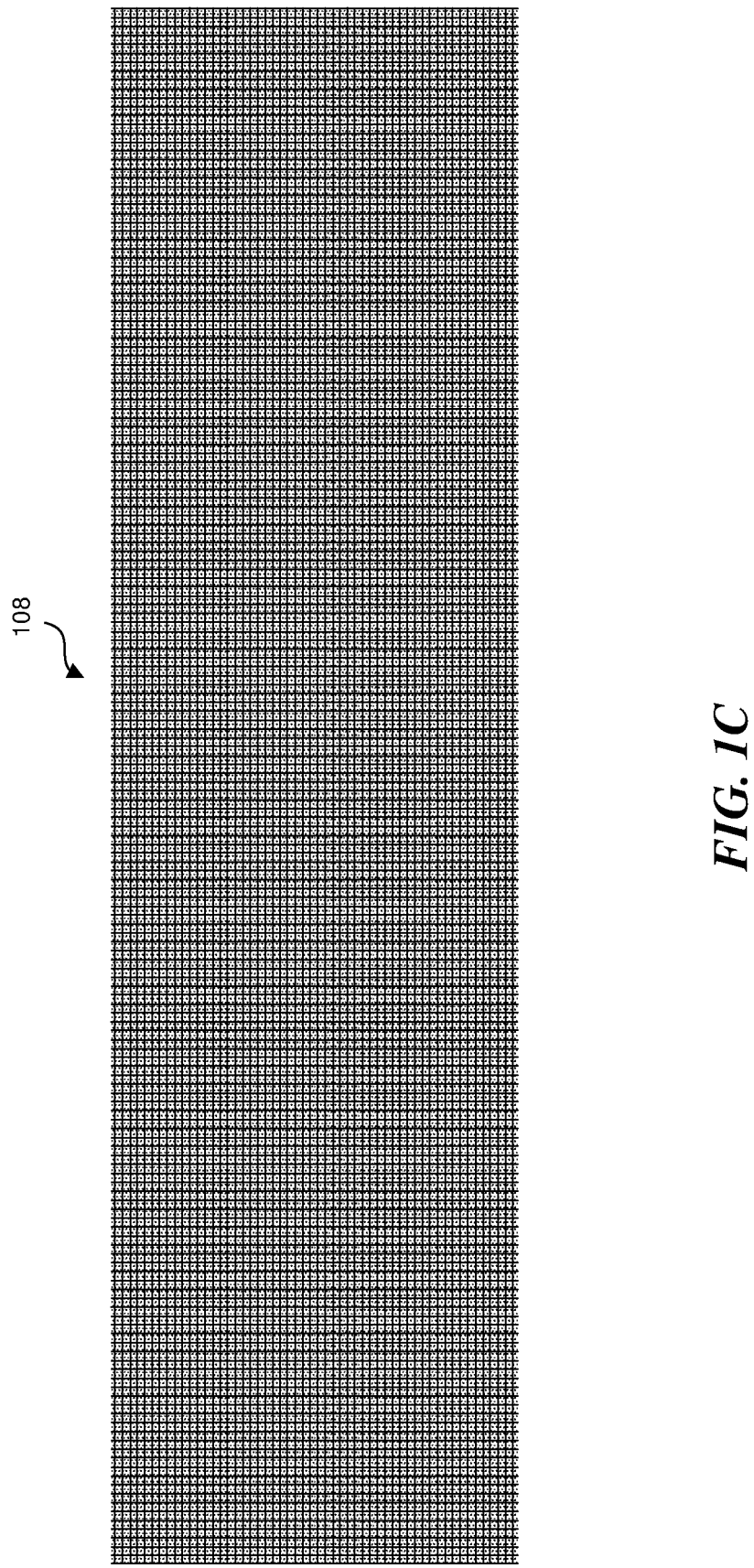
FIG. 1C is a top view of a conventional top metal layer.
Figure 1D:
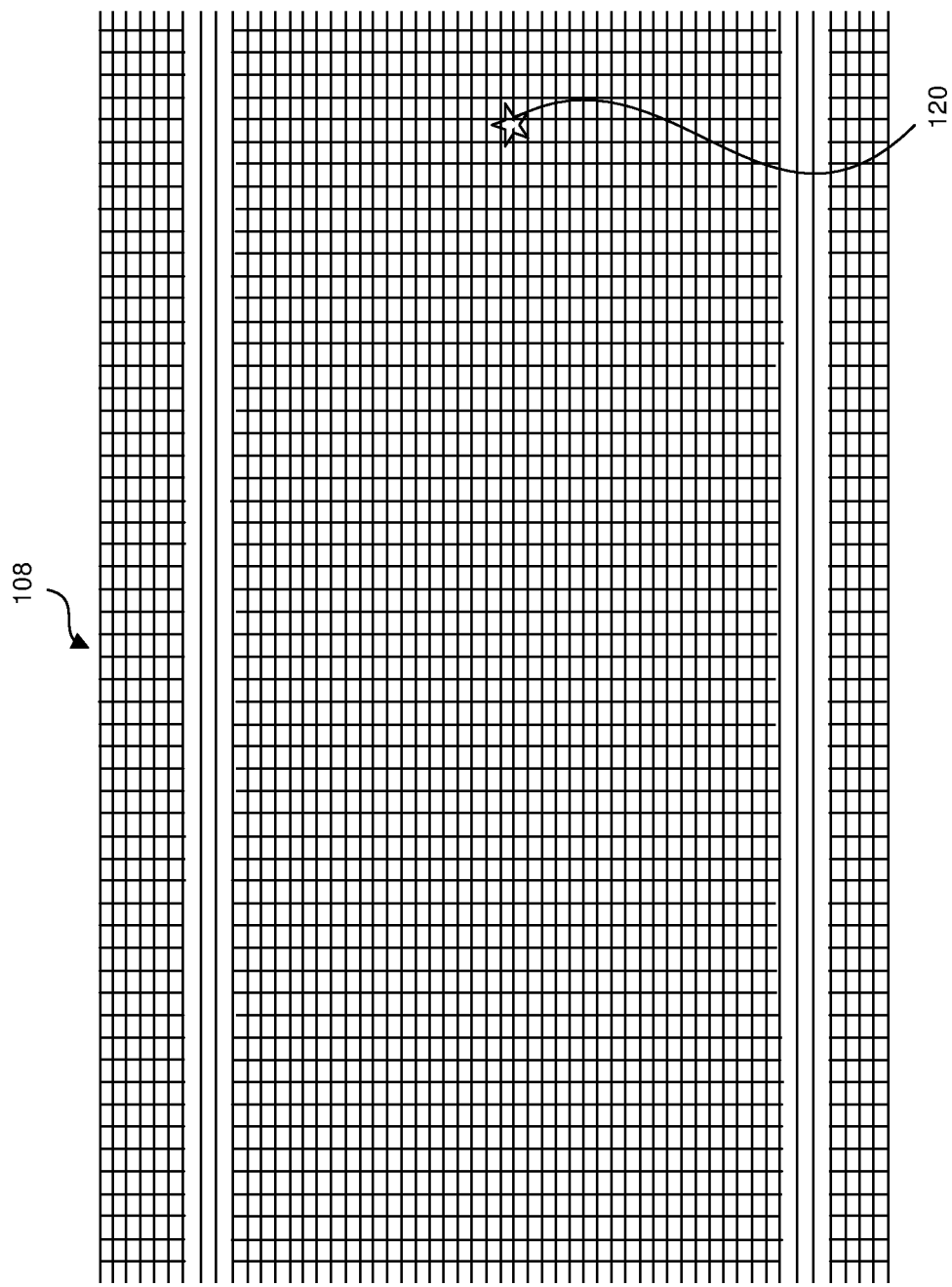
FIG. 1D is a top view of a portion of the silicon device including a defective circuit.
Figure 1E:
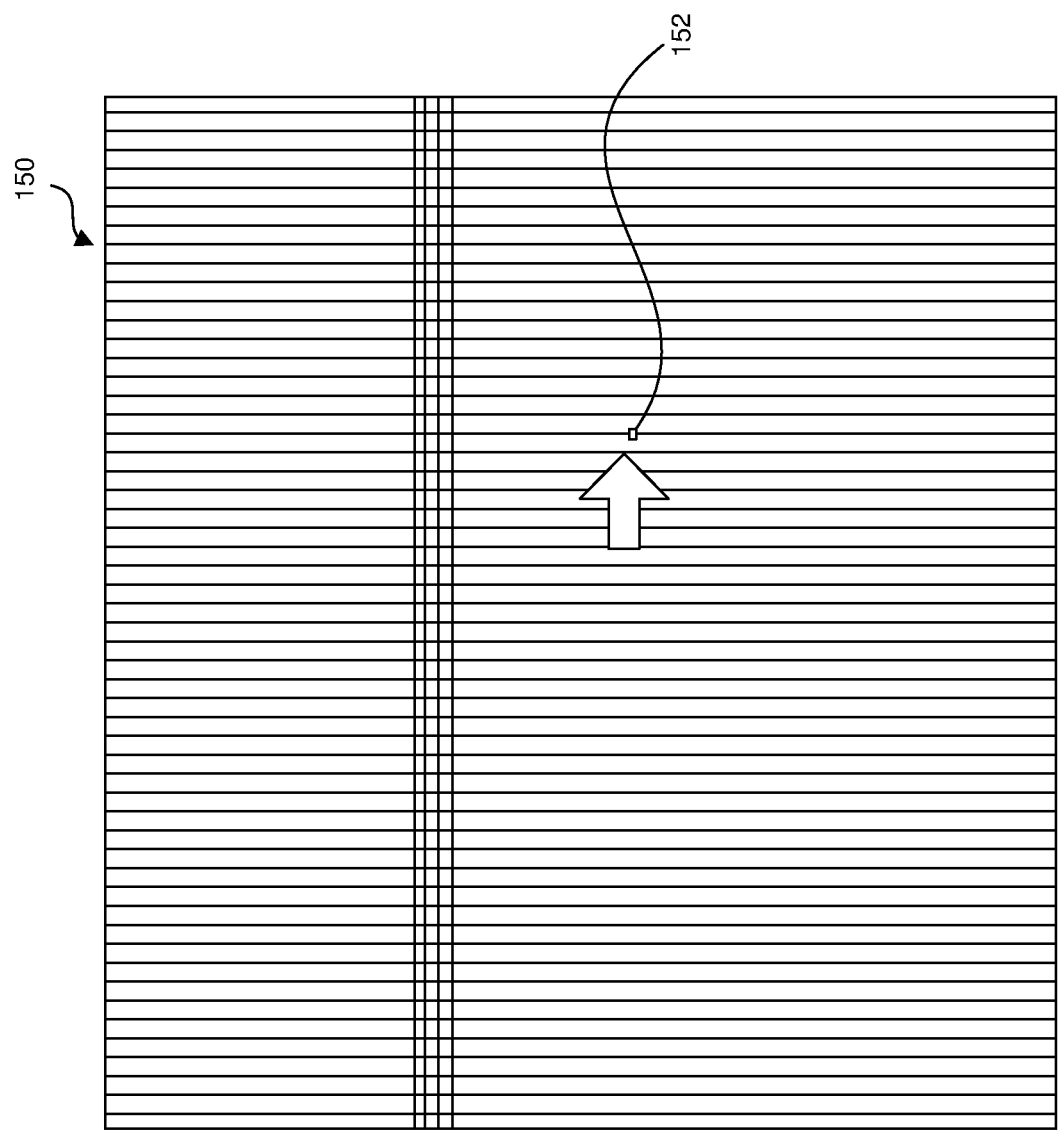
FIG. 1E is an example display illustrating a portion of the silicon device including the defective circuit.
Figure 1F:
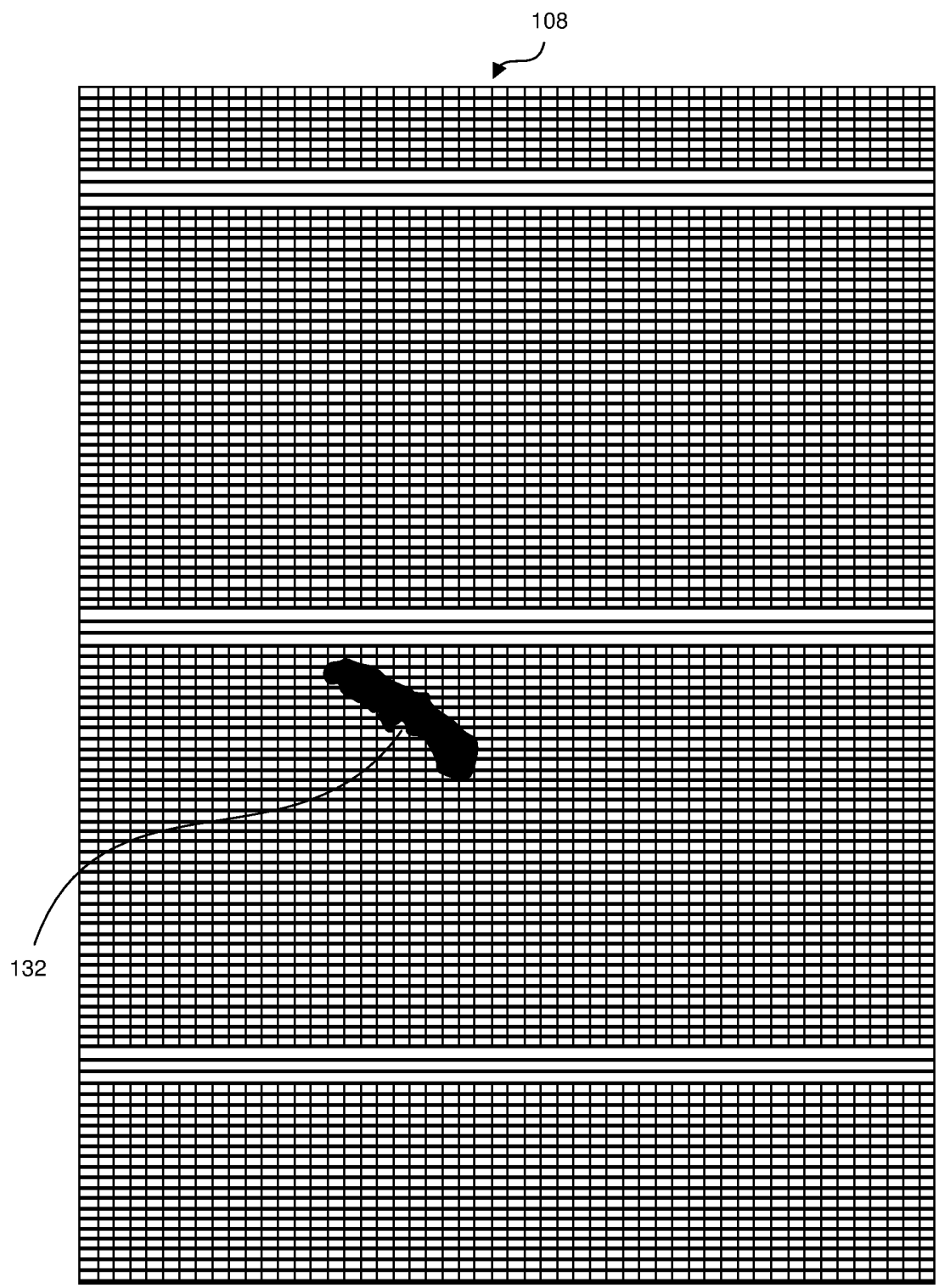
FIG. 1F is a top view of a portion of the silicon device including a surface defect.

In some embodiments, the defect 402 may be visual to a human inspector, with or without magnifying lenses/apparatus. In some embodiments, the defect 402 may be captured by a camera that detects light waves having wavelengths in the visible spectrum. In viewing the defect 402, the section labels 272 can be seen adjacent to and/or overlapping the defect 402. Accordingly, a human inspector can identify that the defect 402 is located in one or more regions corresponding to the adjacent/overlapping section label 272 and/or the label pixels 330. Thus, the section labels 272 and/or the label pixels 330 provide an improved locating mechanism for the human inspector in comparison to conventional designs (e.g., FIG. 1F).

Figure 5:
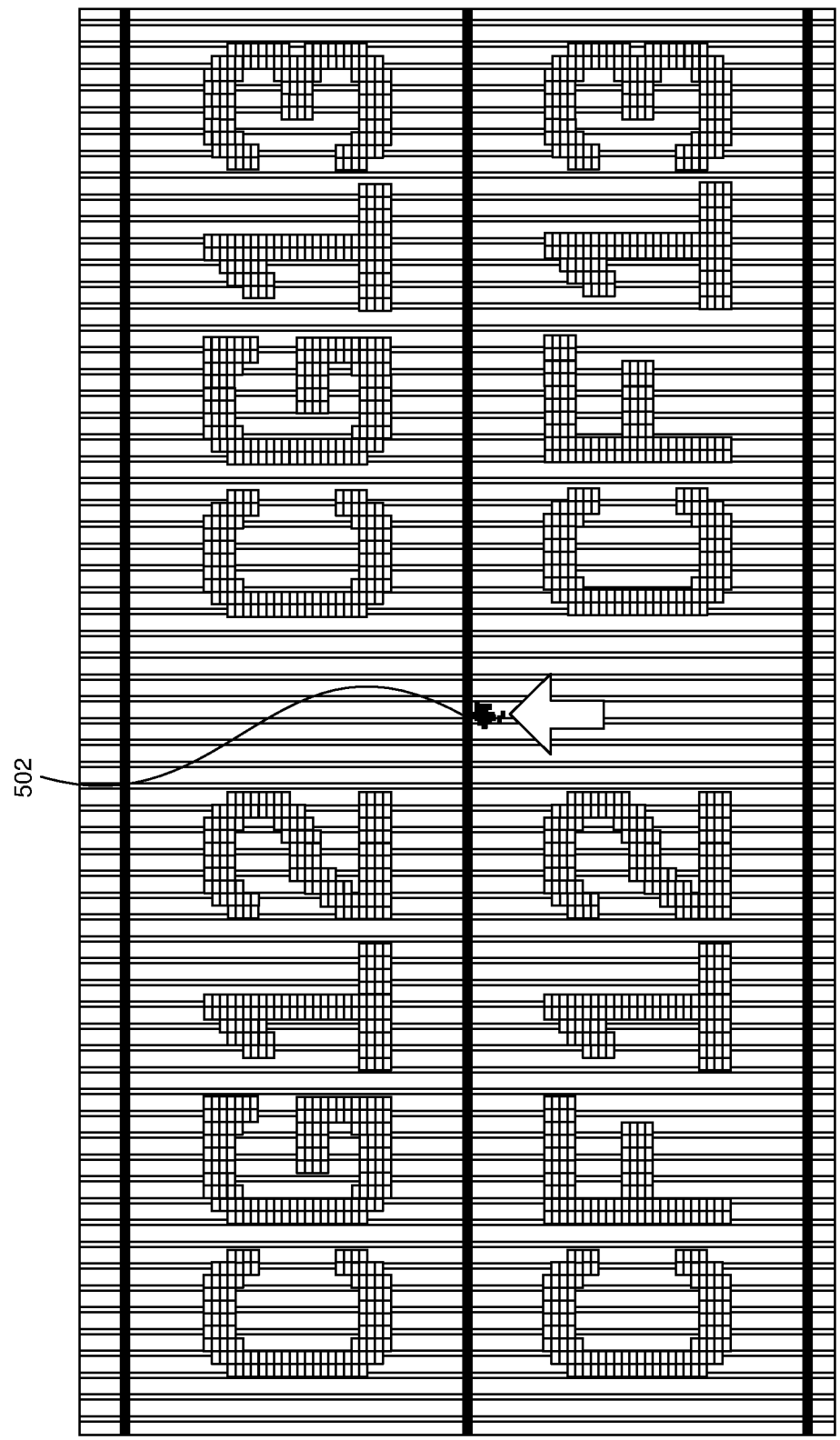
FIG. 5 is a display illustrating a portion of the apparatus in accordance with an embodiment of the present technology.

For further illustrating example defects relative to the section labels 272, FIG. 5 is a display illustrating a portion of the apparatus in accordance with an embodiment of the present technology. In some embodiments, the device 250 of FIG. 2B may be examined using an analysis tool, such as an emission microscope, a laser imaging device, an x-ray-based imager, an infrared-based imager, etc. The analysis tool may detect and/or visualize internal defects 502 in the device 250 based on detection signals (e.g., light waves) propagating through the device 250 and/or reflecting off one or more portions therein. For example, the analysis tool may display hot spots and/or electrical shorts within the device 250 based on detecting heat (i.e., radiated/reflected infrared signals).

In addition to detecting/visualizing the internal defects 502, the analysis tool can simultaneously depict the section labels. Since the section labels 272 include the identifier filler 320 of FIG. 3C different from other surrounding slots 314 of FIG. 3C, propagation/reflection of the detection signals can be affected differently for the section labels 272 than the surrounding slots 314. Accordingly, the analysis tool can detect and visualize distinctions between the section labels 272 and the surrounding region along with the internal defects 502. Thus, the section labels 272, including the identifier filler 320, provide an improved locating mechanism for locating the internal defects 502 in comparison to conventional designs (e.g., FIG. 1D and/or FIG. 1E).

Figure 6:
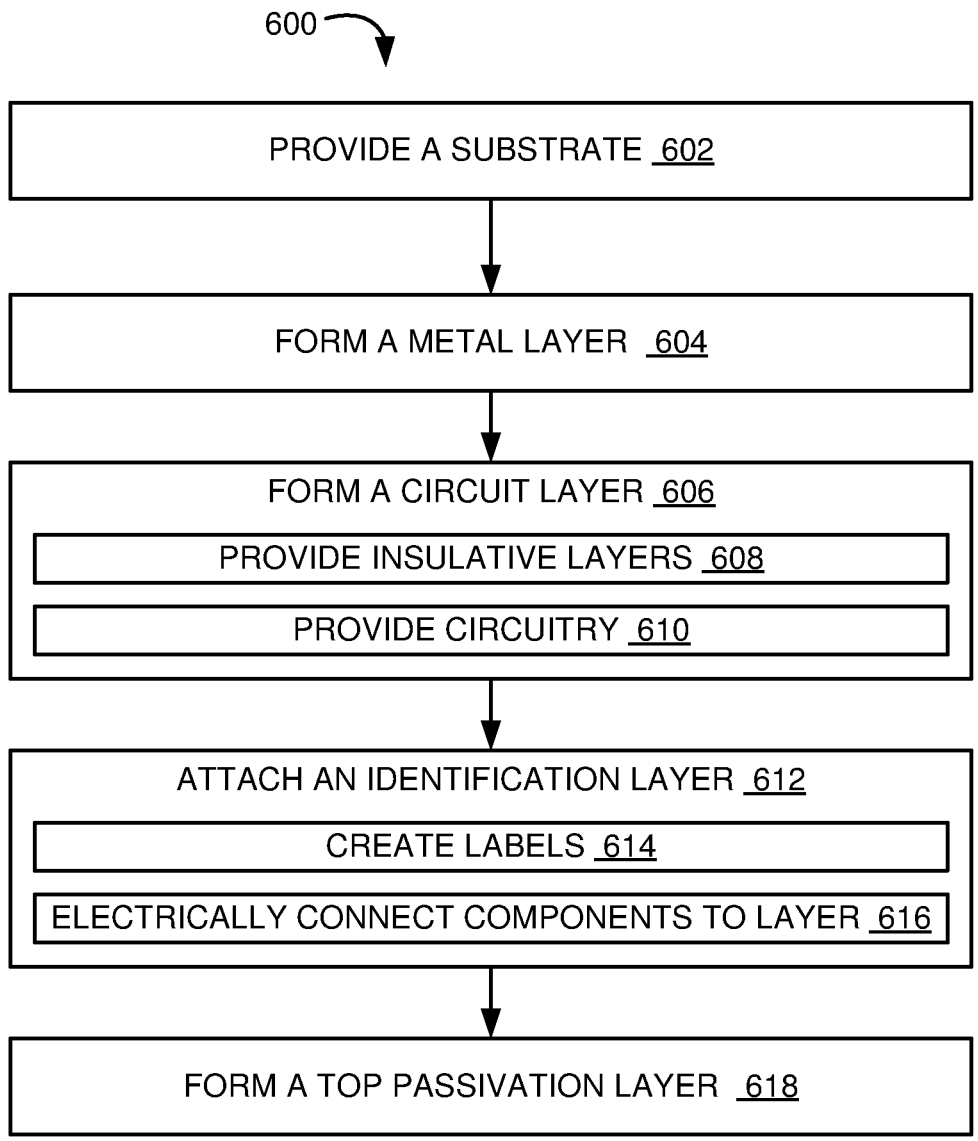
FIG. 6 is a flow diagram illustrating an example method of manufacturing an apparatus in accordance with an embodiment of the present technology.

FIG. 6 is a flow diagram illustrating an example method 600 of manufacturing an apparatus (e.g., the memory device 200 of FIG. 2A, a portion thereof, and/or the device 250 of FIG. 2B) in accordance with an embodiment of the present technology. The method 600 can include a process to manufacture the apparatus that includes the location identifier layer 270 of FIG. 2B having section labels 272 of FIG. 2B therein.

At block 602, a substrate (e.g., the substrate 252 of FIG. 2B) can be provided for manufacturing the apparatus. The substrate can include semiconductor material (e.g., silicon-based material) and/or a core material (e.g., ceramic, glass, and/or epoxy material), such as for PCBs.

At block 604, a metal layer (e.g., the metal layer 254 of FIG. 2B) can be formed. At block 606, a circuit layer (e.g., the circuit component layer 256 of FIG. 2B) can be formed. In some embodiments, forming the circuit layer can include providing one or more insulative layers (e.g., the insulative layers 260 of FIG. 2B) as illustrated at block 608 and/or providing circuitry (e.g., components in the circuit component layer 256, such as transistors, resistors, capacitors, etc.) as illustrated at block 610. In some embodiments, the blocks 604-610 can include depositing materials (e.g., insulative materials, doping materials, and/or conductive/metallic materials), removing materials (via, e.g., etching and/or chemical-mechanical planarization), and/or doping regions for forming semiconductor devices and/or integrated circuits. In some embodiments, blocks 604-610 can include attaching circuitry components to each other and/or the substrate.

At block 612, an identification layer (e.g., the location identifier layer 270 of FIG. 2B, such as a metallic mesh structure) can be attached over the circuit layer. In some embodiments, such as illustrated at block 614, labels (e.g., the section labels 272 of FIG. 2B) can be created for the identification layer. For example, select instances of the slots 314 of FIG. 3C can be filled with the identifier fillers 320 of FIG. 3C to form/display numbers, letters, and/or symbols for the section labels 272. The locations of the section labels 272 and/or the filled instances of the slots 314 can correspond to locations of the circuitry components and/or a grid system over the substrate 252. The process to fill the slots 314 with the identifier fillers 320 can be implemented before and/or after attaching the identification layer over the circuit layer.

In some embodiments, such as illustrated at block 616, attaching the identification layer can include electrically coupling the identification layer to one or more of the circuitry components. For example, the one or more of the circuitry components in the circuit layer can be directly connected to or directly contact one or more portions of the metallic mesh structure. Also, the one or more of the circuitry components and the metallic mesh structure can be coupled through another circuitry component and/or conductive structures (e.g., metallic pillars, through-silicon vias (TSVs), wires, etc.). Accordingly, the identification layer can be electrically coupled (via, e.g., reflowing solder and/or fusing metallic structures or portions thereof) to one or more circuitry components in the circuit layer and/or a voltage reference (e.g., a source voltage or an electrical ground).

At block 618, a top passivation layer (e.g., the passivation layer 262 of FIG. 2B, an encapsulant, etc.) can be formed over the identification layer. In some embodiments, one or more physical characteristics of the top passivation layer can be different than that of the fillers for the section labels 272 as described above. In some embodiments, the top passivation layer can have physical characteristics for allowing light to pass, such that the section labels 272 in the location identifier layer 270 remains visible through the top passivation layer. In some embodiments, the top passivation layer, the substrate 252, and/or the identifier fillers 320 can have physical characteristics that allow the section labels 272 to be visible through the top passivation layer and/or the substrate, such as when viewing the circuit component layer 256 through an analysis tool.

Figure 7:
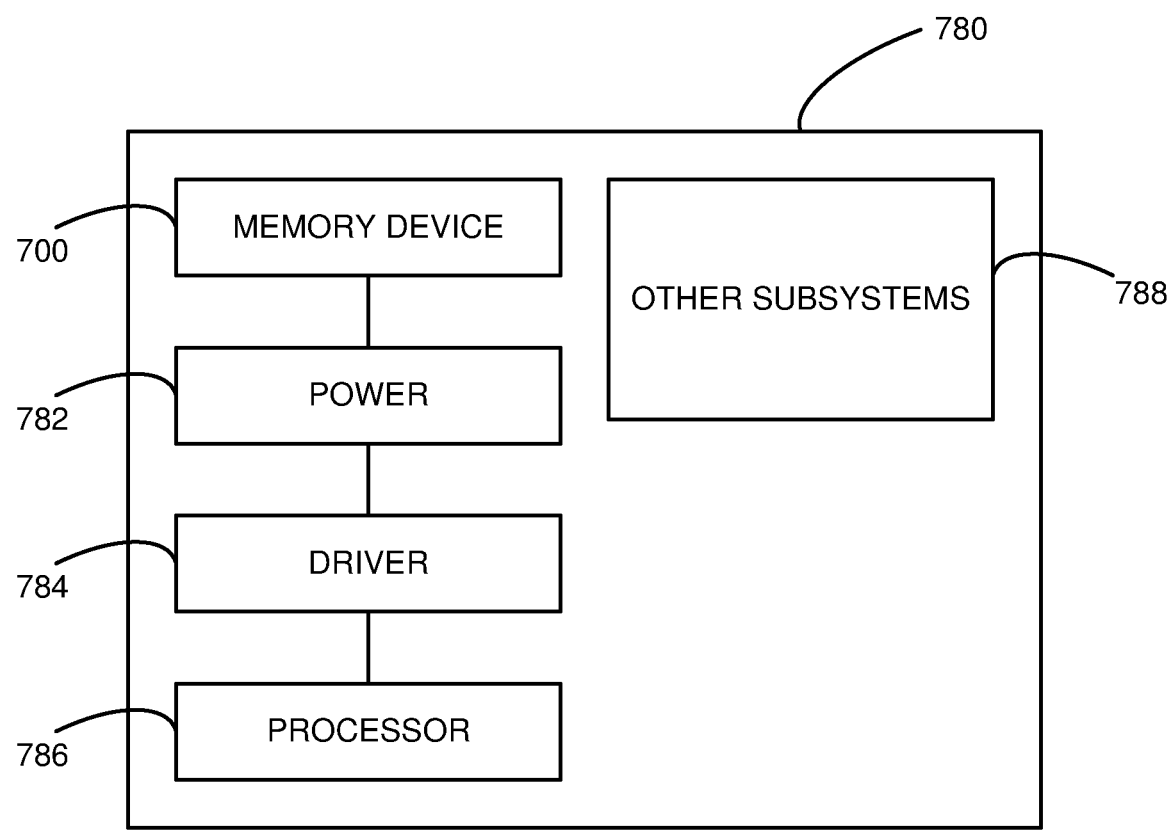
FIG. 7 is a schematic view of a system that includes an apparatus in accordance with an embodiment of the present technology.

FIG. 7 is a schematic view of a system that includes a memory device in accordance with embodiments of the present technology. Any one of the foregoing memory devices described above with reference to FIGS. 2A-6 can be incorporated into any of a myriad of larger and/or more complex systems, a representative example of which is system 780 shown schematically in FIG. 7. The system 780 can include a memory device 700, a power source 782, a driver 784, a processor 786, and/or other subsystems or components 788. The memory device 700 can include features generally similar to those of the memory device described above with reference to FIGS. 2A-6, and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances, and other products. Components of the system 780 may be housed in a single unit or distributed over multiple, interconnected units (e.g., through a communications network). The components of the system 780 can also include remote devices and any of a wide variety of computer readable media.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

We claim:

1. An apparatus, comprising:
   a substrate;
   circuit components disposed on the substrate;
   a planar mesh over the circuit components; and
   one or more section labels formed on the planar mesh, the one or more section labels corresponding to physical locations of the circuit components.

2. The apparatus of claim 1, wherein the one or more section labels include filler material patterned into the planar mesh.

3. The apparatus of claim 2, wherein the planar mesh is electrically conductive and comprises a top metal layer.

4. The apparatus of claim 3, wherein the filler material is a dummy filler.

5. The apparatus of claim 2, wherein a top metal layer is configured to connect to a supply voltage or a ground connection.

6. The apparatus of claim 1, wherein each of the section labels (1) correspond to a macro-cell that includes a region in the planar mesh, and (2) include a number, a letter, a shape, or a combination thereof for identifying the unique region.

7. The apparatus of claim 6, wherein:
   the planar mesh includes slots, and
   the one or more section labels include a subset of slots that are filled with a filler material to provide the number, the letter, the shape, or the combination thereof.

8. The apparatus of claim 7, wherein each of the subset of slots that are filled with the filler in the planar mesh is configured to provide a reference for further locating the circuit components.

9. The apparatus of claim 1, wherein:
   the one or more section labels are arranged along a plane that is between the circuit components and a top surface of the apparatus.

10. The apparatus of claim 9, further comprising:
    a top passivation layer over the planar mesh; and
    wherein:
    the one or more section labels are visible through the top passivation layer.

11. The apparatus of claim 10, wherein:
    the top passivation layer includes a first material; and
    the one or more section labels include a second material having at least one physical characteristic different than the first material.

12. The apparatus of claim 1, wherein the apparatus comprises a semiconductor device.

13. A method of manufacturing an apparatus, the method comprising:
    providing a substrate;
    forming circuit components over the substrate;
    attaching a planar mesh structure over the circuit components; and
    forming one or more section labels on the planar mesh, wherein the one or more section labels are located relative to the circuit components for providing locational reference to the circuit components.

14. The method of claim 13, wherein forming the one or more section labels includes patterning a number, a letter, a shape, or a combination thereof on a layer disposed between a top surface of the apparatus and the circuit components.

15. The method of claim 13, wherein:
    the planar mesh includes slots; and
    forming the one or more section labels includes filling a subset of the slots with filler material.

16. The method of claim 15, wherein the planar mesh structure comprises a metallic layer and the filler material is a dummy filler.

17. The method of claim 16, further comprising:
    connecting the metallic layer to a voltage source or an electrical ground.

18. The method of claim 15, further comprising:
    forming a top passivation layer over the planar mesh structure, wherein the filler material is detectable through the top passivation layer.

19. The method of claim 15, further comprising:
    attaching a top metal layer over and electrically coupled to the circuit components; and
    wherein:
    forming the one or more section labels includes filling a subset of the slots with filler material; and
    forming circuit components includes:
        forming a first metal layer over the substrate,
        forming at least one insulative layer over the first metal layer, and
        forming the circuit components over at least one insulative layer, wherein at least one of the circuit components are electrically coupled to the first metal layer.

20. A semiconductor device, comprising:
    a substrate;
    a circuit layer over the substrate, wherein the circuit layer includes a set of components that are arranged in a repetitive pattern along at least one lateral plane;
    a top metal layer over the circuit layer, wherein the top metal layer includes slots;
    a filler material within the slots for providing visual references in locating and identifying defects and/or components in the circuit layer;

an encapsulant over the top metal layer, the circuit layer, and the substrate; and wherein:

the filler material is detectable through the encapsulant.

\* \* \* \* \*